United States Patent [19]
Williams et al.

[11] Patent Number: 6,123,766
[45] Date of Patent: Sep. 26, 2000

[54] METHOD AND APPARATUS FOR ACHIEVING TEMPERATURE UNIFORMITY OF A SUBSTRATE

[75] Inventors: Meredith J. Williams, Santa Clara; David S. Ballance, Cupertino; Benjamin Bierman, Milpitas; Paul Deaton; Brian Haas, both of San Jose; Nobuyuki Takahashi, Santa Clara; James V. Tietz, Fremont, all of Calif.

[73] Assignee: Applied Materials, Inc., Santa Clara, Calif.

[21] Appl. No.: 08/872,123

[22] Filed: May 16, 1997

[51] Int. Cl.[7] .................................................. C30B 25/16
[52] U.S. Cl. .............................. 117/85; 117/86; 117/202; 118/715
[58] Field of Search .............................. 117/85, 86, 202; 118/715

[56] References Cited

U.S. PATENT DOCUMENTS

| 5,155,336 | 10/1992 | Gronet et al. | 219/411 |
|---|---|---|---|
| 5,436,172 | 7/1995 | Moslehi | 117/85 |
| 5,462,012 | 10/1995 | Chiu | 117/86 |
| 5,695,556 | 12/1997 | Tamamura et al. | 117/86 |
| 5,755,511 | 5/1998 | Peuse et al. | 374/128 |
| 5,782,974 | 7/1998 | Sorensen et al. | 117/86 |

OTHER PUBLICATIONS

Rosler et al., "Tungsten chemical vapor deposition characteristics using SiH in a single wafer system", Journal of Vacuum Science Technology B vol. 6 (6) pp. 1721–1727, Nov. 1988.

Schaper et al., "Thermal model validation for rapid thermal chemical vapor deposition of polysilicon", journal of Electrochemical Society, vol. 143, No. 1 pp. 374–381, Jan. 1996.

*Primary Examiner*—Robert Kunemund
*Attorney, Agent, or Firm*—Fish & Richardson

[57] ABSTRACT

A method for controlling the temperature of a substrate in a processing chamber. The processing chamber employs a heating control over at least two heating zones. Each heating zone is independently controllable according to a measured signal corresponding to the substrate temperature and a user-definable offset.

15 Claims, 7 Drawing Sheets

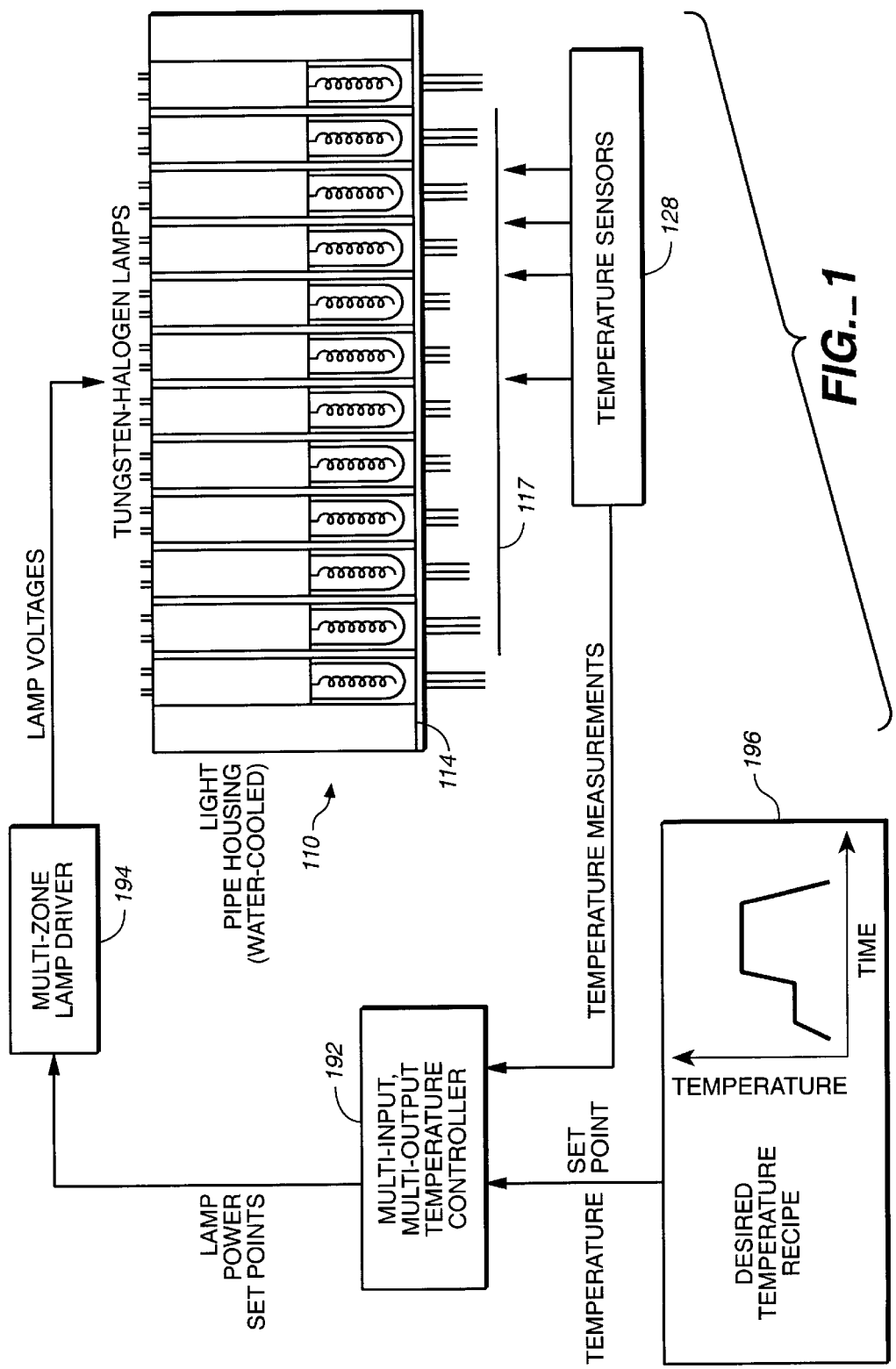
FIG._1

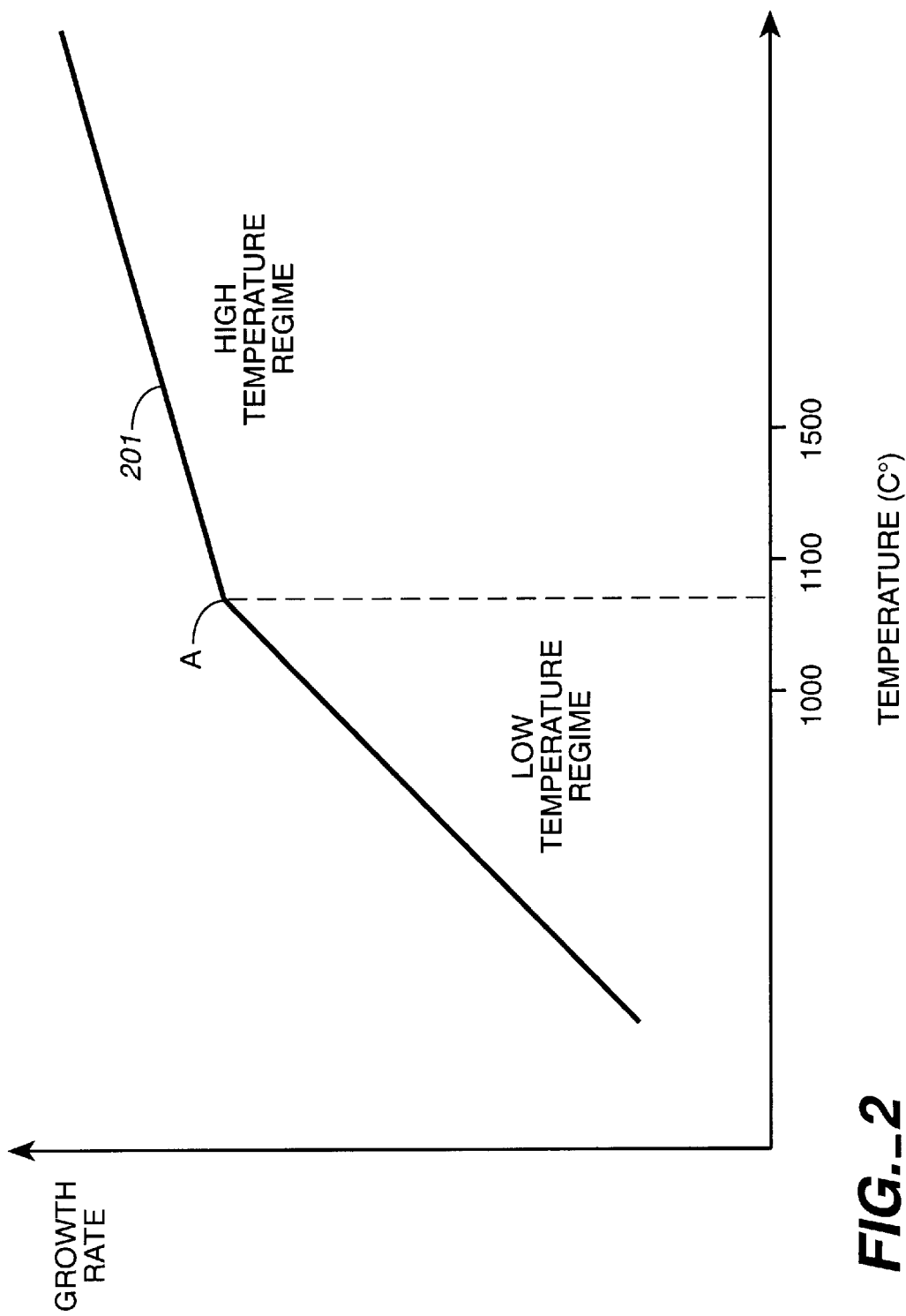
FIG._2

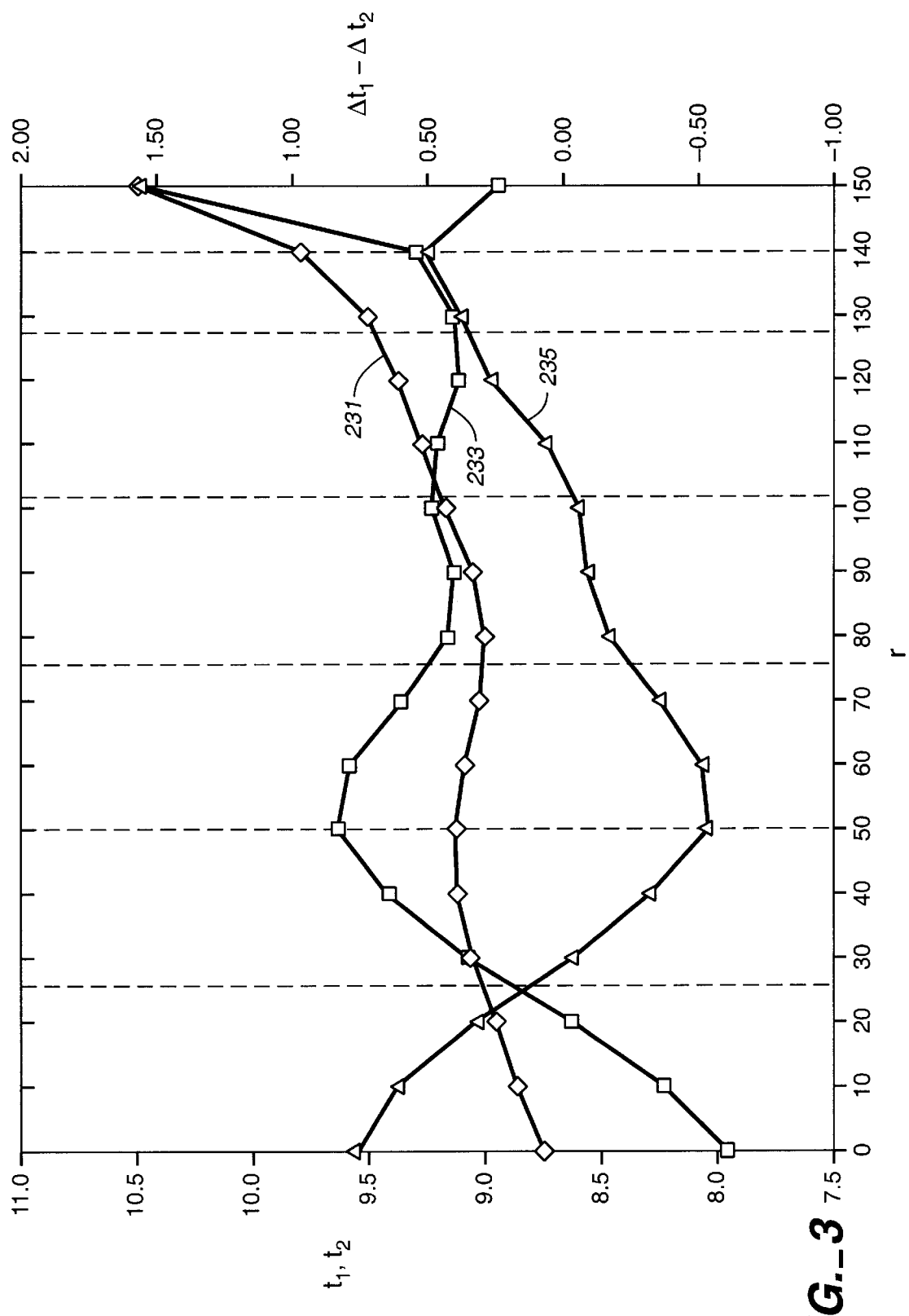
FIG._3

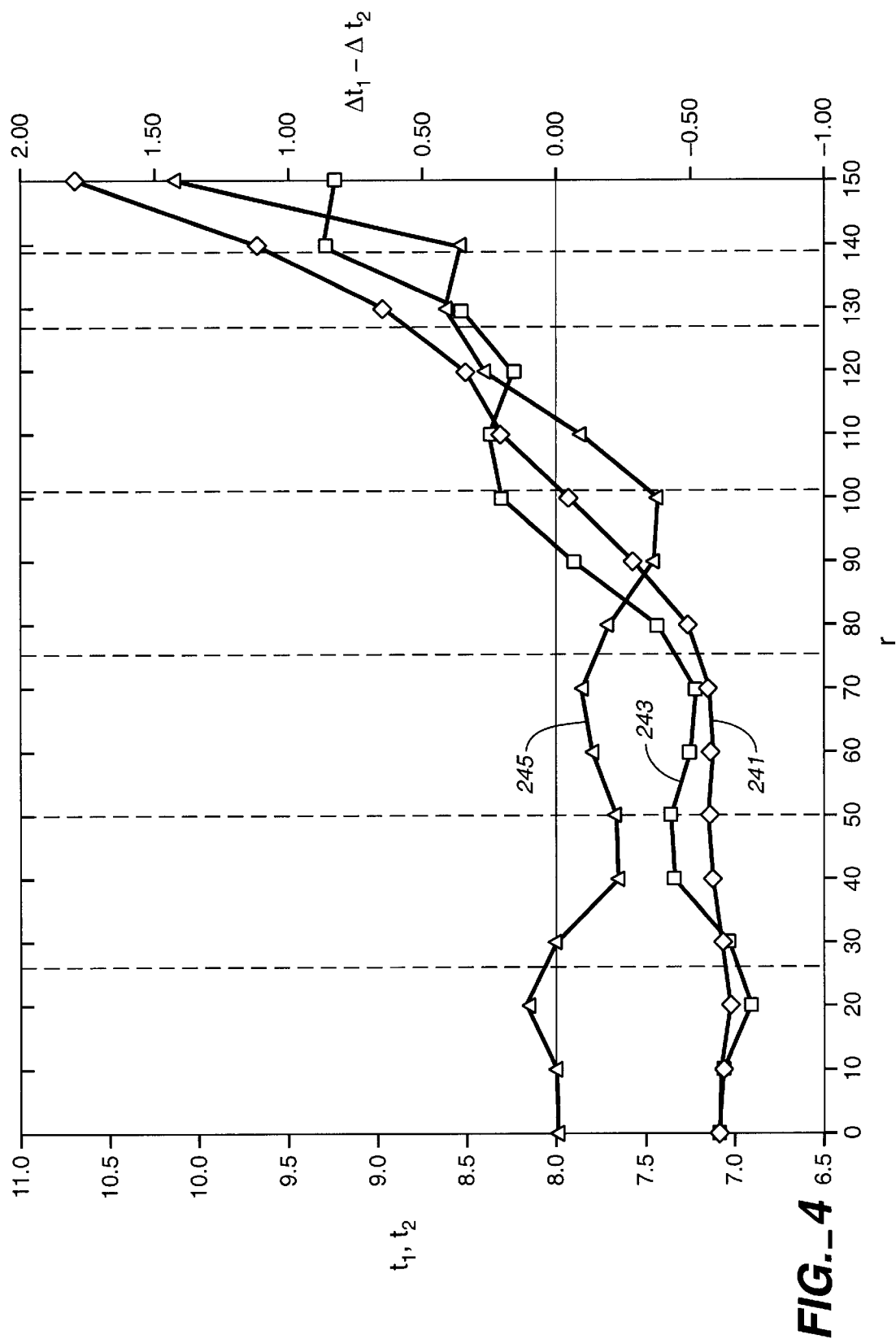
FIG._4

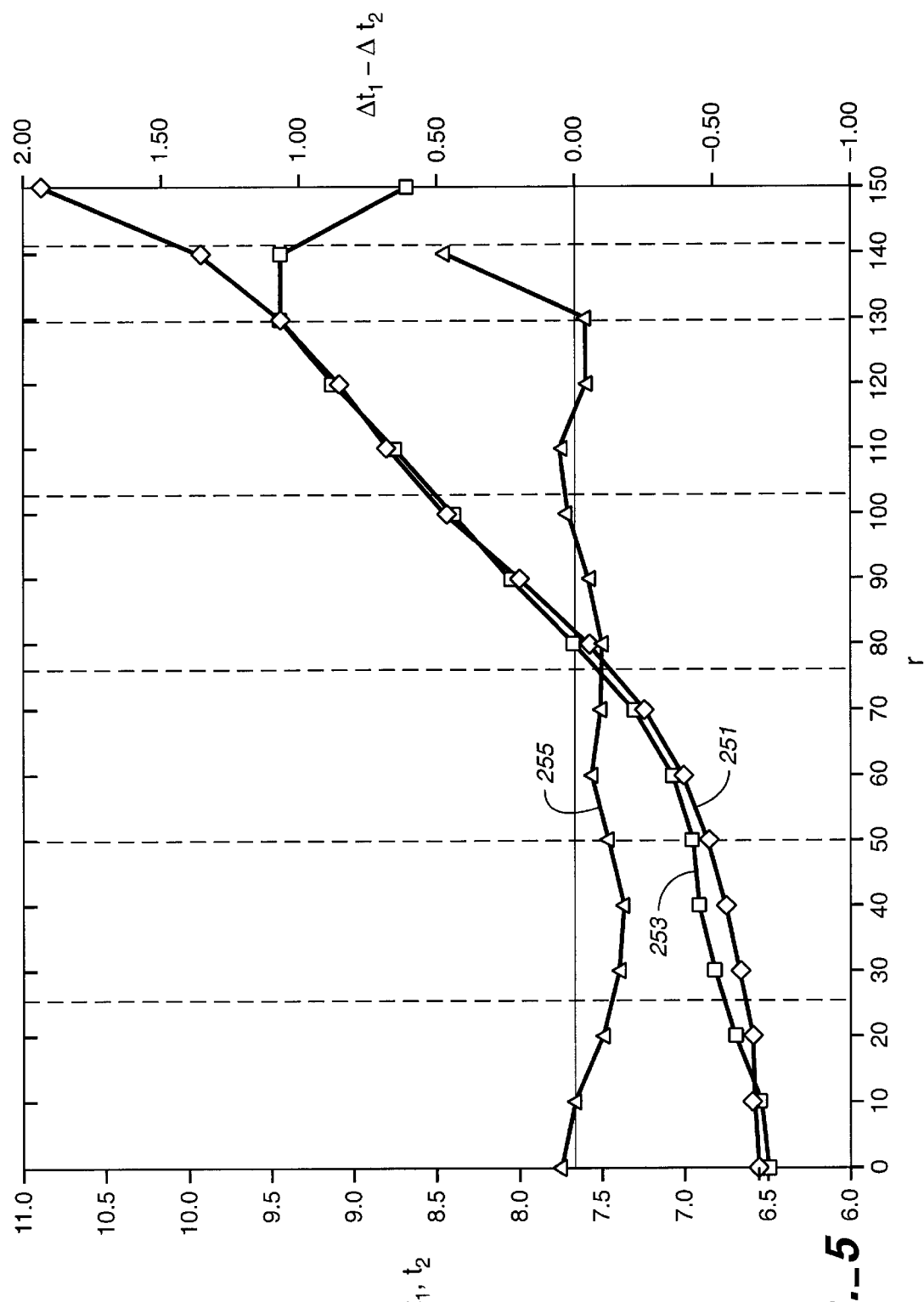
FIG._5

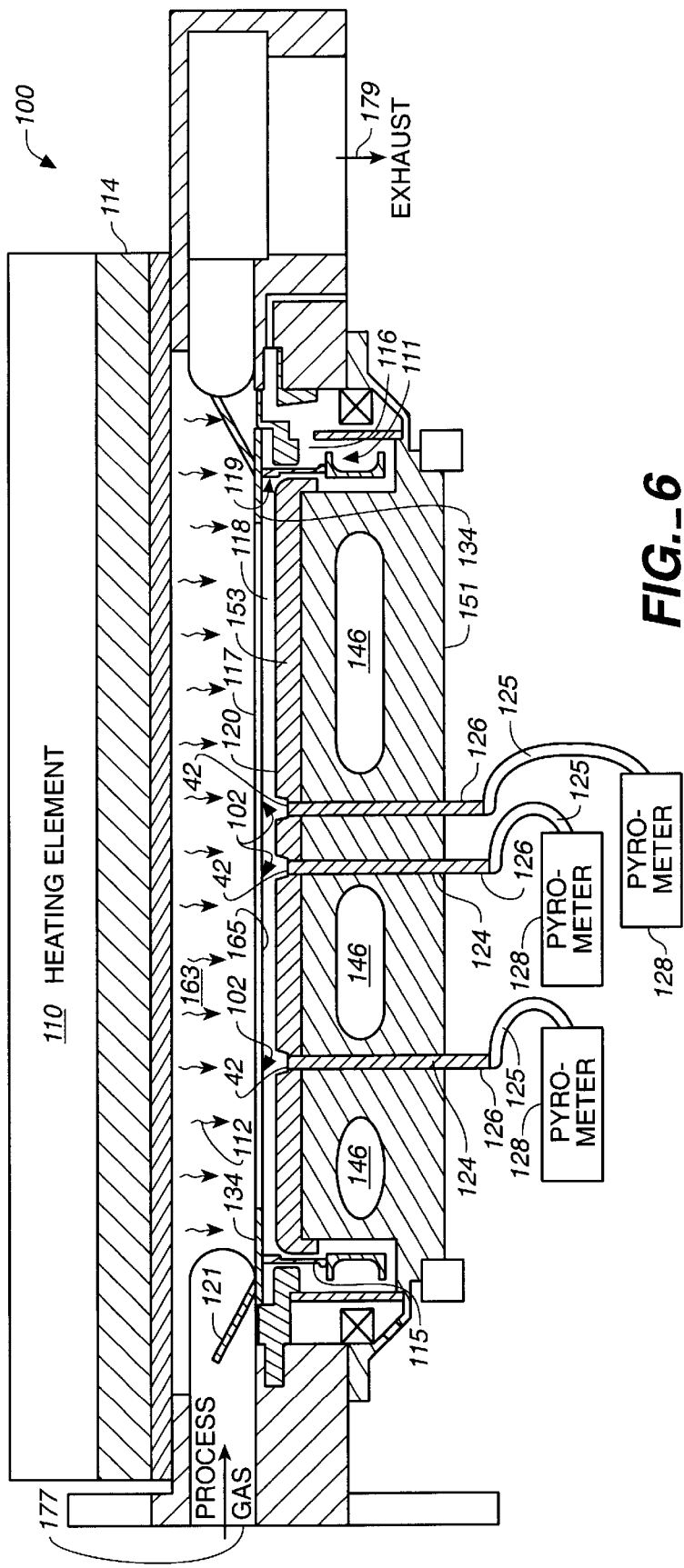
FIG._6

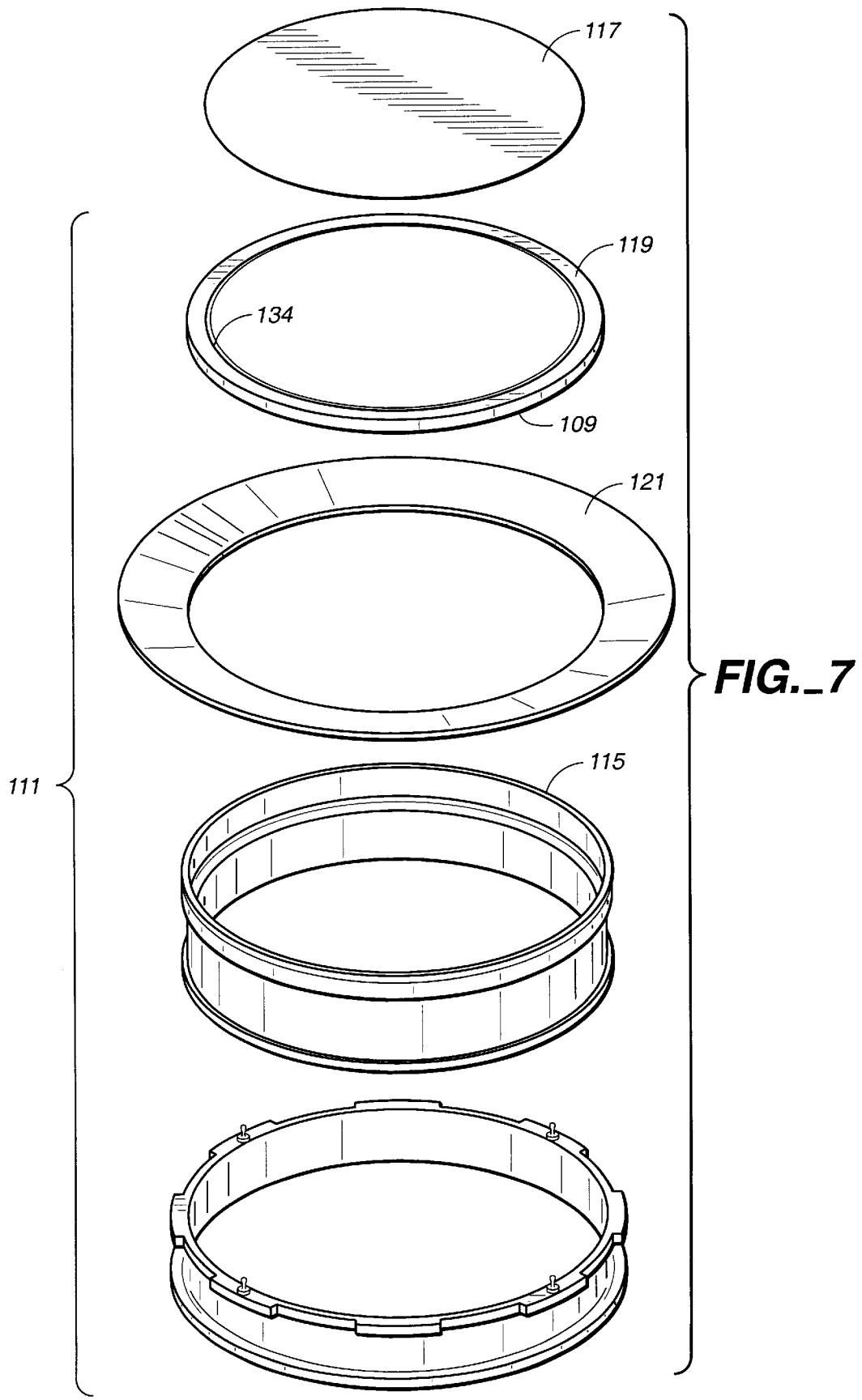
FIG._7

METHOD AND APPARATUS FOR ACHIEVING TEMPERATURE UNIFORMITY OF A SUBSTRATE

FIELD OF THE INVENTION

The invention relates to achieving temperature uniformity of a semiconductor substrate, and more particularly to a method of achieving temperature uniformity across a substrate by performing a calibration in which two films are grown on two substrates, each in different growth regimes. The thickness variations of the films over the extent of the substrates are measured and the results are used to establish optimum heating parameters. The method is particularly appropriate for growth processes such as epitaxial growth in which a number of process variables bear on the uniformity and quality of growth.

BACKGROUND OF THE INVENTION

In many semiconductor device manufacturing processes, the required high levels of device performance, yield, and process repeatability can only be achieved if the temperature of a substrate (e.g., a semiconductor wafer) is strictly controlled during processing. To achieve that level of control, it is often necessary to measure the substrate temperature in real time and in situ, so that any unexpected temperature variations can be detected and corrected.

Such corrections may be accomplished by using process chambers with independent heating control over various portions of a substrate. For example, some process chambers include a plurality of heating elements, such as lamps, positioned over the substrate to be heated. Depending on the local temperature of the substrate, the power to these lamps may be varied to provide temperature uniformity across the entire substrate.

As an example of a fabrication process using such a plurality of lamps, consider rapid thermal processing (RTP), which is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the formation of complementary metal-oxide-semiconductor (CMOS) gate dielectrics by RTO or RTN, film growth temperature is a critical parameter that influences device performance and fabrication yield. Currently, CMOS devices are being made with dielectric layers that are only 60–80 angstroms (Å) thick and for which thickness uniformity must be held within a few percent. This level of uniformity requires that temperature variations across the substrate during high temperature processing cannot exceed a few degrees Celsius (° C.).

The wafer itself often cannot tolerate even small temperature differentials during high temperature processing. If the temperature differential is allowed to rise above, for example, 1–2° C./cm at 1200° C., the resulting stress is likely to cause slip in the silicon crystal. The resulting slip planes will destroy any devices through which they pass. To achieve that level of temperature uniformity, reliable real-time, multi-point temperature measurements for closed-loop temperature control are often used.

One way in which the temperature is measured to achieve uniformity is optical pyrometry, which is widely used for measuring temperatures in RTP systems. Pyrometry exploits a general property of objects, namely, that objects emit radiation with a particular spectral content and intensity that is characteristic of their temperature. Thus, by measuring the emitted radiation, the object's temperature can be determined. A pyrometer measures the emitted radiation intensity and performs the appropriate conversion to obtain temperature. The relationship between spectral emitted intensity and temperature depends on the spectral emissivity of the substrate and the ideal blackbody radiation-temperature relationship, given by Planck's law:

$$I_b(\lambda, T) = \frac{2C_1}{\lambda^5 \left(e^{\frac{C_2}{\lambda T}} - 1\right)} \quad (1)$$

where $C_1$ and $C_2$ are known constants, $\lambda$ is the radiation wavelength of interest, T is the substrate temperature measured in Kelvins (K), and $I_b(\lambda T)$ is the spectral intensity as a function of wavelength and temperature. According to an approximation known as Wein's distribution law, this expression can be rewritten as follows:

$$I_b(\lambda, T) \approx K(\lambda) \cdot e^{-\frac{C_2}{\lambda T}} \quad (2)$$

where $K(\lambda) = 2C_1/\lambda^5$. This is a good approximation for temperatures below about 2700° C.

The spectral emissivity $(\lambda T)$ of an object is the ratio of its emitted spectral intensity $I(\lambda T)$ to that of a blackbody at the same temperature $I_b(\lambda T)$. That is, $$\epsilon = \frac{I(\lambda, T)}{I_b(\lambda, T)} \quad (3)$$

Since $C_1$ and $C_2$ are known constants, under ideal conditions, the temperature of the wafer can be accurately determined if $(\lambda T)$ is known.

However, despite its widespread use in the semiconductor industry, optical pyrometry still suffers from limitations due to its inability to accurately measure the emissivity of the substrate. Moreover, even if the emissivity of the substrate is known at a given temperature, it changes with temperature. The changes are usually not accurately measured. Thus, they can introduce an unknown error into the temperature measurements. Errors on the order of 10° C. or more are not uncommon.

The emissivity of a substrate depends on many factors, including the characteristics of the wafer itself (e.g. temperature, surface roughness, doping level of various impurities, material composition and thickness of surface layers), the characteristics of the process chamber, and the process history of the wafer. Therefore, a priori estimation of substrate emissivity cannot provide a general purpose pyrometric temperature measurement capability.

Techniques for reducing the effect of changes in wafer emissivity on temperature measurements are known. One such technique involves placing a thermal reflector near the back surface of a target substrate to form a reflecting cavity which causes thermal radiation from the substrate to be reflected back to the substrate. A light pipe, which is inserted through the reflector into the cavity, samples radiation from the reflecting cavity and delivers the sampled light to a pyrometer. Assuming an ideal reflector, it can be shown mathematically that because all of the thermal radiation emitted from the substrate is reflected back onto the substrate, the reflecting cavity acts like an ideal black body. That is, the intensity of the thermal radiation within the reflecting cavity will not be a function of the emissivity of the surface of the substrate. Stated differently, in the ideal case, the reflecting cavity increases the effective emissivity of the substrate to a value equal to one. However, because the reflector will be less than perfect, the effective emissivity of the substrate will be higher than the emissivity of the wafer but less than one. Nevertheless, variations in the actual emissivity of the wafer will have considerably less impact on the measured temperature.

The above discussion relates to techniques for increasing the accuracy of substrate temperature measurements. These techniques use feedback to the heating sources to enhance substrate temperature uniformity.

Another way to increase substrate temperature uniformity is to use a temperature-sensitive process such as an oxide growth to grow a test film on a wafer. Oxide growth on silicon occurs at well-characterized rates for varying temperatures. By growing an oxide on silicon for a known amount of time and then measuring the thickness of the grown oxide as a function of the wafer radius using an ellipsometer or profilometer, the local temperature of the substrate may be obtained (also as a function of radius). Here, the term "local temperature of the substrate" is used to mean the temperature at a specified small area of the substrate, where "small" refers to a characteristic size over which the temperature variation is minimal.

The variation of thickness with radius may then be used as a guide to vary the power of the heat sources. For example, where the grown layer is too thick, the power to the heat source is lowered. This is referred to as adjusting the "offset" to a given zone of the heat source. An electrical offset is provided to the pyrometers (often just a value in ° C.) so that the pyrometer readings are adjusted in such a way so as to make the substrate temperature uniform.

However, this method often may not be ideal for growth systems such as epitaxial silicon deposition. One reason is that the gas chemistry in a growth chamber may be highly non-uniform because of gas flow dynamics as well as the cracking chemistry of epitaxial growth precursor gases such as $SiHCl_3$. Such unstable gas flows may lead to uneven film growth which makes the measurement of the thickness of the grown film as a function of radius far less reliable.

Another reason why the above method may not be ideal for epitaxial systems is that, in the case of growing a test oxide film, it is sometimes seen that there is a chemical incompatibility between the process gases used for epitaxial growth, such as silane ($SiH_4$), trichlorosilane ($SiHCl_3$), etc., and oxygen sources.

Thus, though the above-mentioned schemes have achieved acceptable results, there is still considerable room for improvement, especially in the area of growth systems having multiple growth regimes such as epitaxial growth.

SUMMARY OF THE INVENTION

In one aspect, the invention is directed to a method for controlling the temperature of a substrate in a processing chamber. The processing chamber employs a heating control over at least two heating zones such that each heating zone is independently controllable according to a measured signal corresponding to the substrate temperature and a user-definable offset. The method comprises the steps of: growing a first film on a first substrate using a first growth regime and measuring a first thickness profile across the surface of the first film; growing a second film on a second substrate using a second growth regime and measuring a second thickness profile across the surface of the second film. A plurality of differences is determined between the first thickness profile and the second thickness profile. A value of an offset for at least one of the heating zones is selected such that the selected value bears a direct relationship to the differences.

Implementations of the invention may include one or more of the following. The differences may be measured at a plurality of temperature sampling points. The heating zones may each include a plurality of heating sources, such as lamps, and a plurality of pyrometers in a closed-loop configuration, each pyrometer providing a measured signal. The first film may be grown in a low temperature regime where substrate temperature provides the primary contribution to growth rate, and the second film may be grown in a high temperature regime where gas flow dynamics provides the primary contribution to growth rate. The first film may be grown at a temperature of less than about 1050° C. at a pressure of about one atmosphere, and the second film may be grown at a temperature of greater than about 1150° C. at a pressure of about one atmosphere.

In another aspect, the invention is directed to a method for removing the effect of a variable on temperature uniformity across a substrate processed in a chamber. The chamber employs an independent heating control over at least two heating zones. Each heating zone is independently controllable according to a measured signal corresponding to a substrate temperature and a user-definable offset. The method comprises the steps of growing a first film on a first substrate using a first growth regime where the variable constitutes a minor contribution to a first growth rate and measuring a first thickness profile across the surface of the first film; and growing a second film on a second substrate using a second growth regime where the variable constitutes a major contribution to a second growth rate and measuring a second thickness profile across the surface of the second film. A plurality of differences are calculated between the first thickness profile and the second thickness profile. A value of the offset of each heating zone control is then selected such that the selected values bear a direct relationship to the plurality of calculated differences.

Implementations of the invention may include one or more of the following. The variable, for example, may be gas flow, a function of gas velocity or a function of gas mass.

It is an advantage of the present invention that temperature non-uniformities may be lowered for growth systems which have more than one growth regime, such as polysilicon and amorphous silicon. The invention is particularly advantageous in the context of epitaxial processes. It is a further advantage that no chemically incompatible processes need be performed in order to achieve substantial temperature uniformity. It is yet a further advantage that, for epitaxial silicon growth, the temperature of the substrate is substantially uniform with less reliance on adjusting power to the heat sources.

Other advantages and features of the present invention will become apparent from the following description, including the drawings and claims.

BRIEF DESCRIPTION OF THE DRAWINGS

FIG. 1 is a schematic diagram of a temperature control system.

FIG. 2 is a graph of growth rate on the y-axis versus temperature on the x-axis, showing two different growth regimes.

FIG. 3 is a graph of thickness variation as a function of radius (r) on the x-axis, showing a large thickness variation between two growth regimes. The left-hand y-axis shows values of thickness $t_1$, $t_2$, while the right-hand y-axis shows values of the difference of thickness variation $\Delta t_1 - \Delta t_2$ between two growth regimes.

FIG. 4 is a graph of thickness variation as a function of radius (r) on the x-axis, showing a medium variation of thickness between two growth regimes. This medium variation was achieved using a method according to an embodiment of the present invention. The left-hand axis shows values of thickness $t_1$, $t_2$, while the right-hand axis shows values of the difference of thickness variation $\Delta t_1 - \Delta t_2$ between two growth regimes.

FIG. 5 is a graph of thickness variation as a function of radius (r) on the x-axis, showing a small variation of thickness between two growth regimes. This small variation was achieved using a method according to an embodiment of the present invention. The left-hand y-axis shows values of thickness $t_1$, $t_2$, while the right-hand y-axis shows values of the difference of thickness variation $\Delta t_1 - \Delta t_2$ between two growth regimes.

FIG. 6 is a cross-sectional view of an RTP chamber which may be used in a method according to the present invention.

FIG. 7 is an exploded perspective view of a portion of the RTP chamber which may be used in the method according to the present invention, showing in particular certain rotational components and the wafer.

DETAILED DESCRIPTION

In the following description, the temperature of a substrate is discussed. The term "substrate" broadly covers any object that is being processed in a thermal processing chamber and the temperature of which is being measured during processing. The term "substrate" includes, for example, semiconductor wafers, flat panel displays, and glass plates or disks.

FIG. 1 shows a control loop for controlling the heating of a substrate 117 to a desired temperature. It uses the sampled output from a number of temperature sensors such as pyrometers 128. A heating element 110 includes a number of lamps arranged in radial heating zones. The term heating zones refers to the elements in the control loop, including heating element 110, pyrometers 128, as well as the other components constituting this loop.

A suitable heating element 110 is disclosed in above-mentioned U.S. Pat. No. 5,155,336, entitled "Rapid Thermal Apparatus and Method", assigned to the assignee of the present invention and incorporated herein by reference. This heating element uses a number of light pipes to deliver highly collimated radiation from a plurality of tungsten-halogen lamps, for example, to processing chamber 100 (FIG. 6). The lamps may be divided into seven zones which are located in a radially symmetrical manner. The power supplied to the different zones can be individually adjusted to allow the radiative heating of different areas of substrate 117 to be precisely controlled.

Pyrometers 128 produce signals indicative of the measured temperatures. These signals provide feedback for the closed-loop heating zone control. For convenience, each lamp within heating element 110, and each pyrometer, is assigned to a "zone". For example, if seven pyrometers are used, there may be seven zones. Each pyrometer has an offset to calibrate the pyrometer. More details of the temperature control system are provided in U.S. patent application Ser. No. 08/641,477 for "A Method and Apparatus for Measuring Substrate Temperatures," filed May 1, 1996, assigned to the assignee of the present invention and incorporated herein by reference.

Each zone of lamps is separately powered by a multi-zone lamp driver 194 that is, in turn, controlled by a multi-input, multi-output controller 192. Since the substrate rotates and temperature measurements are made at different radial locations on the backside of substrate 117, each temperature probe produces an average temperature over a different predetermined annular region of the substrate. The annular regions coincide with the radial zones of the heat lamps. A controller 192 receives the temperature measurements that are generated by pyrometers 128, corrects the temperatures based upon a temperature correction algorithm, and adjusts the power level of the heating lamps to achieve a substrate temperature as specified by a predefined temperature cycle profile 196 that is supplied to controller 192.

The temperatures read by pyrometers 128 are altered by the use of "offsets". These offsets are simply user-definable values which are added to or subtracted from the measured signals to achieve a desired result. The units of offsets, may be, e.g., in ° C. As the response from any two pyrometers varies due to slight differences in manufacturing conditions, the offsets may be used so that multiple pyrometers may be individually calibrated against a common standard. These offsets are used in the present invention to achieve substantial temperature uniformity across a wafer or substrate. The establishment of offsets for this purpose may be performed, for a given chamber, prior to a new chamber hardware setup. The offsets may not require revision until a hardware change is made.

Throughout the process cycle, the controller automatically adjusts the power levels delivered to the different lamp zones so that any temperature deviations away from the desired temperature profile are corrected for.

As noted above, the method of the present invention may be used to grow epitaxial films as well as other types of films. The thickness of an epitaxial film is known to be a function of substrate temperature and of the dynamics of the process gas flow. If a grown film has a non-uniform thickness, one or both of these parameters probably has a non-uniform value across the surface of the substrate.

Epitaxial growth may have a number of different growth regimes. Two of these regimes are described here. The first is a low temperature regime (less than about 1050° C. at a pressure of about one atmosphere for silicon). The second is a high temperature regime (greater than about 1150° C. at a pressure of about one atmosphere for silicon). It should be noted that these high and low temperatures are material- and process-dependent.

These two regimes are shown in FIG. 2 which is a graph of growth rate versus substrate temperature, shown as curve 201. The portion of curve 201 to the left of the point "A" represents the low temperature regime; the portion to the right of the point "A" represents the high temperature regime. In RTP processes, for example, where very thin films are formed, growth rate is typically expressed in microns per minute. Arbitrary units are used for the growth rate in this figure. As shown between 1000° C. and 1100° C., an "elbow" in the curve occurs at point "A", separating the two different growth regimes. The location of this elbow varies for different chambers, different process parameters, and different materials grown.

The thickness of an epitaxial film is known to be a function of substrate temperature and the dynamics of process gas flow. The first growth regime, the "surface reaction limited" or "low temperature regime", is characterized by a relatively high slope. In this regime, the substrate temperature provides the main contribution to the growth rate. The second growth regime, the "mass transfer limited" or "high temperature regime", may have a more gradual slope than that of the low temperature regime. In this regime, the flow dynamics of the process gases provides the primary contribution to the growth rate. Process gas flow dynamics may be due to gas velocity, gas mass, both, or other aerodynamic effects present in the chamber. Note that while the slopes in FIG. 2 appear approximately linear, curve 201 may also be a complicated sum of powers or complex exponentials.

The method of the present invention uses at least one characteristic feature of the flow dynamics to eliminate or substantially reduce the flow dynamics' contribution to growth. This characteristic feature is that the flow dynamics' contribution to the growth rate stays relatively constant as the temperature changes.

In brief, the method includes the growth of at least two films on two different substrates. One film is grown at a low temperature so that the film is grown in the low temperature growth regime. Another film is grown at a high temperature so that the film is grown in the high temperature growth regime. Thickness profiles are taken of both films and one profile is subtracted from the other to obtain a difference plot. By way of this subtraction, the effect of the flow dynamics is effectively removed. The difference plot that remains is indicative of the contribution of temperature only to the growth rate. By using this indicator of thickness nonuniformity, offsets to the heating sources (alternatively, to the pyrometers inferring the effective output of the heating sources) may be determined.

In an example process, each of the above two films would be grown on a separate dummy wafer and analyzed according to the invention. The result of this analysis is the set of offsets which may be then assigned to the heating zone control described above with reference to FIG. 1. Once these offsets are assigned, the chamber may be used in a regular processing environment for deposition on wafers with enhanced temperature control and uniformity.

An example of this method follows. In this example, a special calculation is performed to obtain the thickness non-uniformity t. In particular, the thickness non-uniformity t at any point on the wafer is defined as the difference between the film thickness, t, at that same point, and the average film thickness across the wafer, t̄ (the average thickness is a single number and is equal to the integral of the thickness over the area, divided by the area of the wafer). The thickness non-uniformity is thus given by t=t−t̄.

Generally, the thickness non-uniformity is given by:

$$\Delta t(F,T,r) = X(T,r) + Y(F,r) + Z(F,T,r) \quad (4)$$

where
r=radius of the substrate;
T=temperature of the substrate;
F=a function representing the process gas flow and, in particular, its dependence on gas velocity and mass flow;
X=a function representing the dependence of thickness on the temperature and radius of the substrate;
Y=a function representing the dependence of thickness on the process gas flow and radius of the substrate; and
Z=a function representing the dependence of thickness on an interaction between the variables of process gas flow and substrate temperature. For example, Z would represent, in part, the cracking chemistry of the epitaxial growth precursor gases.

As noted, the method of the invention involves the deposition of two films on two separate wafers, one at a low temperature regime and the other at a high temperature regime. If, for example, films were deposited at temperatures of 1050° C. and 1150° C. (as may be used particularly but not exclusively for films grown at atmospheric pressure), the following expressions would be obtained:

$$\Delta t_1(F,1150°\ C.,r) = X(1150°\ C.,r) + Y(F,r) + Z(F,1150°\ C.,r) \quad (5)$$

$$\Delta t_2(F,1050°\ C.,r) = X(1050°\ C.,r) + Y(F,r) + Z(F,1050°\ C.,r) \quad (6)$$

By subtracting Equation 6 from Equation 5, the following expression for the difference in thickness non-uniformity is obtained:

$$\Delta t_1 - t_2 = X(1150°\ C.,r) - X(1050°\ C.,r) + 0 + Z(F,1150°\ C.,r) - Z(F,1050°\ C.,r) \quad (7)$$

In most processes, the interaction between the gas flow dynamics and the substrate temperature is minimal. For minimal interaction, that is, $Z \ll X$, any differences in film thickness between the two deposition temperatures may be attributed substantially to the difference in temperature of the substrate. The offsets for any given r, described above, may then be adjusted according to the value of $\Delta t_1 - \Delta t_2$. This serves to adjust the offsets substantially according to temperature variation, with little or no dependence on process gas flow dynamics. For example, the offsets may be adjusted so that the substrate temperature is made lower in regions which are overly thick, i.e., $t \gg \bar{t}$; similarly, the substrate temperature may be made higher in regions which are overly thin, i.e., $t \ll \bar{t}$.

FIG. 3 shows an example of film thickness variations for two epitaxial films prior to use of the present invention. In this figure, and in FIGS. 4 and 5, the x-axis represents the distance along a radius (r) of a substantially circular silicon wafer. Since the wafer has a diameter of 300 mm, this axis, as shown, has values from 0 to 150 mm. The left-hand y-axis represents the thickness of the two grown films. The right-hand y-axis represents the difference in thickness variation $\Delta t_1 - \Delta t_2$ between the two grown films.

In FIG. 3, curve 233 (using the left-hand axis) represents $t_1$ for a first film grown on a first substrate as described above with respect to Equations (4)–(7), except that this film was grown at 1120° C. Curve 231 (using the left-hand axis) represents $t_2$ for a second film grown on a second substrate as described above, except that this film was grown at 1040° C. Curves 231 and 233 are obtained by measuring a first and second thickness profile across the surface of the first and second films, respectively. A plurality of difference data points, $\Delta t_1 - \Delta t_2$, are calculated and shown by curve 235 (using the right-hand axis). Each vertical line in FIG. 3 represents the position along the radius of the wafer of one of the pyrometers. In this example, there are seven pyrometers and thus seven vertical lines (neglecting the line representing the right-hand y-axis). The points at which the data points and their differences are measured may correspond to the points at which pyrometers 128 measure the temperature, referred to here as the "temperature sampling points".

As can be seen in FIG. 3, the thickness variation of the film grown in a low temperature regime varies greatly from that grown in a high temperature regime (curve 233 as compared to curve 231). Their difference curve 235 also fluctuates widely.

In the method of the present invention, difference curve 235 is then made the basis for establishing the values of a plurality of offsets for the heating zone control system. In particular, the offsets are established so that they bear a direct relationship to the plurality of calculated differences.

The required offsets so established are approximately a linear function of the observed thickness differences, this function having a negative slope. That is, a positive thickness difference ($\Delta t_1 > \Delta t_2$) requires an offset increase in order to decrease the magnitude of the thickness difference. Higher order corrections to the linear fit may also be necessary. One reason for this may be because each lamp group necessarily has "cross talk" with other lamp groups so that offset changes or power changes in one group will induce a response in adjacent groups. This response may be characterized by a number of gain curves. These gain curves may be used in a temperature control algorithm to solve simultaneous equations which govern how much temperature change in a given group is due to power changes in all the groups. A similar set of gain curves is required to fully characterize the interaction between offset changes for temperature uniformity tuning and the resultant thickness changes.

In the simple example discussed here, if $\Delta t_1 - \Delta t_2$ is large, the offset is adjusted so that the value of $\Delta t_1 - \Delta t_2$ is made smaller. By so doing, the variation in $\Delta t_1 - \Delta t_2$ is reduced. If $\Delta t_1 - \Delta t_2$ is already small, the offset may only need a small adjustment or perhaps none at all.

One result of the method of the present invention is shown in FIG. 4. In FIG. 4, curve 241 represents $t_1$ as described above, except that this film was grown at 1140° C. Curve 243 represents $t_2$ as described above, again at 1040° C. Their difference $\Delta t_1 - \Delta t_2$, is shown, as noted, by curve 245.

Curve 245 has values which are clustered closer around a value of zero than its analogue difference curve (curve 235) in FIG. 3. In other words, since the offsets have been adjusted according to the results of FIG. 3, the thickness curve of the film grown at high temperatures (where process gas flow dynamics effects dominate) appears closer to the thickness curve of the film grown at low temperatures (where temperature effects dominate). Thus, the method of the present invention is useful for reducing the effect of gas flow dynamics on thickness non-uniformity of a film.

An even more stark case is shown in FIG. 5. This figure represents a further iteration of the method. Here, refinements of the offsets are determined by performing the same method using the data from FIG. 4. In other words, the technique is performed twice. First, initial offsets were determined from FIG. 3. These offsets were used to grow the films of FIG. 4. These films were then used to refine the offsets previously determined. This iterative technique may be used to refine the offsets to any desired level of accuracy. In FIG. 5, curve 251 represents $t_1$ as described above, except that this film was grown at 1130° C. Curve 253 represents $t_2$ as described above, again at 1040° C. Their difference $\Delta t_1 - \Delta t_2$, is shown by curve 255.

The low temperature grown film is seen to have almost the same thickness non-uniformity as the high temperature grown film. Thus, the effect of the gas flow dynamics on film thickness non-uniformity has been substantially eliminated. In other words, the difference curve 255 is shown to have values which are clustered very close to the zero value.

Of course, it will be recognized that the invention may be generalized to more than just two regimes. In this way, the effect of variables occurring in a number of regimes may be subtracted out or otherwise accounted for. Likewise, the two regimes described above may be explained in more detail by including sub-regimes. For example, three regimes may be used to explain FIG. 2: the low temperature regime, the high temperature regime, and an "elbow" sub-regime where the low temperature regime crosses over to the high temperature regime.

Similarly, more than two films may be grown in order to remove more than one variable. For example, if the effect of some other relatively uncontrollable variable was desired to be removed, three films may be grown in order to isolate each effect from that occurring solely due to temperature. An example may be to eliminate the effect of not only gas flow dynamics but also geometric effects of an anisotropic deposition source such as a electron beam source.

Even if just two films are grown, the variable whose effect is reduced need not be gas flow dynamics. The effect of any variable may be reduced so long as the chosen variable (1) has an effect that is relatively constant with respect to temperature and (2) has an effect that dominates over a particular range of temperatures.

The method of the invention may also be used in growth processes besides epitaxial growth. For example, any process may benefit in which a dependent variable has multiple slopes with respect to the independent variable. These include, but are not limited to, numerous types of gas chemistries, etching rates, plasma or optical intensity dependencies.

Various types of systems may employ the method of the present invention. One such system is shown in FIG. 6. This system employs heating sources heating a number of zones in which the temperature of the zones are independently controllable.

FIG. 6 shows a processing chamber 100 for processing disk-shaped, twelve-inch (300 millimeter (mm)) diameter silicon (Si) substrate 117. Details of chambers which may be used with the present invention are disclosed in U.S. Patent Applications entitled: "Reflector Cover for a Semiconductor Processing Chamber", to D. S. Ballance et al.; "Magnetically-Levitated Rotor System for an RTP Chamber", to B. Bierman and J. V. Tietz; "Co-Rotating Edge Ring Extension for Use in a Semiconductor Processing Chamber", to D. S. Ballance et al.; and "Method and Apparatus for Purging the Back Side of a Substrate During Chemical Vapor Processing", to P. Deaton et al.; all of which are assigned to the assignee of the present application, filed on even date herewith, and incorporated herein by reference. Of course, a wide variety of other chambers may also use the present invention.

The substrate 117 is mounted inside chamber 100 on a substrate support structure 111 and is heated by heating element 110 located directly above substrate 117. Heating element 110 generates radiation 112 which may enter processing chamber 100 through a water-cooled quartz window assembly 114. The window assembly, in one embodiment, may be located approximately 25 millimeters (mm) above the substrate. Beneath substrate 117 is a reflector 153 which is mounted on a central assembly 151 having a generally cylindrical base. Reflector 153 may be made of aluminum and has a highly reflective surface coating 120. An underside 165 of substrate 117 and the top of reflector 153 form a reflecting cavity 118 for enhancing the effective emissivity of the substrate.

The separation between substrate 117 and reflector 153 is variable. In processing systems that are designed for twelve-inch silicon wafers, the distance between substrate 117 and reflector 153 may be between about 3 mm and 20 mm, and preferably between about 5 mm and 8 mm; the width-to-height ratio of cavity 118 should be larger than about 20:1.

The temperatures at localized regions 102 of substrate 117 are measured by a plurality of temperature probes (only three of which are shown in FIG. 6). Each temperature probe includes a sapphire light pipe 126 that is inserted into a conduit 124 that passes from the backside of central assembly 151 through the top of reflector 153. Sapphire light pipes 126 are about 0.080 inch in diameter and conduits 124 are slightly larger to enable the light pipes to be easily inserted into the conduits. Light pipes 126 are connected to pyrometers 128 via fiber optics 125. As noted, the pyrometers produce a signal indicative of the measured temperature.

A processing region 163 is located generally above substrate 117. In processing region 163, and to a certain extent in other areas of the chamber, process gases are used in conjunction with the temperature control of substrate 117 via lamps 110 to conduct chemical reactions on substrate 117. These reactions include, but are not limited to, oxidation or nitridation film growth, etc. The process gases typically enter processing region 163 through a gas plenum or showerhead located above or to the side of processing region 163. As shown in FIG. 6, these gases enter via a gas inlet 177. If necessary, process gases may be pumped out of the chamber or exhausted by a pumping system 179 of known design. Details of such devices are provided in the U.S. Pat. No. 5,155,336, incorporated by reference above.

Substrate 117 is generally a large diameter silicon wafer. Wafers of other materials may also be used. As noted above, the diameter of substrate 117 is often at least 300 mm, but substrates of any size may be accommodated by the present invention.

Central assembly 151 includes a circulation circuit including chambers 146 fed by coolant inlets (not shown) through which coolant such as a cooled gas or liquid circulates, thereby cooling reflector 153. Water which is typically at about 23C may be circulated through central assembly 151 to keep the temperature of reflector 153 well below that of heated substrate 117 (e.g., 150C or less).

A number of small reflective cavities 42 (i.e., a number of microcavities) are formed in the top surface 120 of reflector 153 where conduits 124 pass through the top of the reflector. Each conduit 124 enters the small cavity forming an aperture (not shown) at the bottom of the small cavity. The sapphire light pipes 126 are positioned within conduits 124 so that their uppermost ends are flush with or slightly below the bottom of each microcavity 42.

As indicated above, light pipes 126 are made of sapphire. Sapphire light pipes are generally preferred as they have relatively small light scattering coefficients, and they tend to have greater transverse light rejection. Thus, they provide greater measurement localization because they accept incoming rays from a smaller solid angle and thus a smaller area of measurement. The light pipes can be made of any appropriate heat-tolerant and corrosion-resistant material, e.g., quartz, that can transmit the sampled radiation to the pyrometer. Suitable quartz fiber light pipes, sapphire crystal light pipes, and light pipe/conduit couplers may be obtained from the Luxtron Corporation-Accufiber Division, 2775 Northwestern Parkway, Santa Clara, Calif. 95051-0903. Alternatively, the radiation sampling system could be an optical system that includes a small-radius objective lens mounted in reflector 153, and a system of mirrors and lenses which communicate radiation collected by each lens to each pyrometer. Such a scheme may be less expensive than sapphire light pipes if appropriate off-the-shelf optical elements are available. Alternatively, light pipes can be made from a tube that has a highly polished reflective inner surface.

As indicated above, although only three measurement probes are shown in FIG. 6, an actual system may use seven or eight measurement probes distributed over the reflector so as to measure the temperature at different radii of the substrate. During thermal processing, support structure 111 is often rotated at about 90 revolutions per minute (RPM), although this can vary over a wide range, especially for epitaxial systems. Thus, each probe actually samples the temperature profile of a corresponding annular ring area on the substrate.

As shown in FIG. 7, support structure 111 may comprise a magnetically-levitated rotating frame. Support structure 111, in use, is located partially in a rotor well 116 (shown in FIG. 6). Support structure 111 supports substrate 117 on an edge ring 119, and rotates substrate 117 under heating lamps 110 (shown in FIG. 6) to provide temperature uniformity.

On the inside region of edge ring 119 is a shelf 134 for supporting substrate 117. Shelf 134 is a region around the inside circumference of edge ring 119 that is lower than the rest of edge ring 119. Edge ring 119 contacts the substrate around the substrate's outer perimeter, thereby leaving all of an underside 165 of substrate 117 exposed except for a small annular region about the outer perimeter. Edge ring 119 has a radial width of approximately 0.75 inch. To minimize the thermal discontinuities that may occur at the edge of substrate 117 during processing, edge ring 119 is made of the same, or a similar, material as the substrate, e.g., silicon (Si) or silicon carbide (SiC).

Edge ring 119, located partially adjacent substrate 117, is subject to corrosion due to its proximity to the processing region 163 where reactive gases deposit material on substrate 117. Edge ring 119, if made of SiC or other such materials, is resistant to such corrosion.

Edge ring 119 is designed to create a light tight seal with a cylinder 115. Extending from the bottom surface of edge ring 119 is a cylindrically-shaped lip or skirt 109 which has an outside diameter that is slightly larger than the outside diameter of cylinder 115, so that it fits over cylinder 115 and forms a light seal. Of course, skirt 109 may connect to cylinder 115 in a number of other ways as well.

Edge ring 119 has an outer radius that is larger than the radius of cylinder 115 so that it extends out beyond cylinder 115. This annular extension of edge ring 119 beyond cylinder 115 functions as a baffle which prevents stray light from entering reflecting cavity 118. To further reduce the possibility of stray light entering reflecting cavity 118, edge ring 119 may be coated with a material that absorbs the radiation generated by heating element 110 (e.g., a black or grey material such as silicon carbide). To further reduce the amount of stray light entering cavity 118, a co-rotating edge ring extension 121 may be used.

Cylinder 115 may be made, for example, of quartz and may be coated with Si to render it opaque in the frequency range of pyrometers 128. The Si coating on cylinder 115 acts as a baffle to block out radiation from external sources that might contaminate the intensity measurements.

The present invention has been described in terms of a preferred embodiment. The invention, however, is not limited to the embodiment depicted and described. Rather, the scope of the invention is defined by the appended claims.

What is claimed is:

1. A method for deriving offset values for use in controlling heating zones used to heat a substrate in a processing chamber so that the temperature of the substrate has a desired profile across the substrate, the offset values being used with actual values representing measured temperatures at locations across the substrate, the method comprising:

growing a film on two respective substrates under two different respective heating conditions, measuring a characteristic of the film across each of the substrates, and deriving the offset values based on a comparison of the measured characteristics of the respective films.

2. The method of claim 1, wherein said heating zones each include a plurality of heating sources and a plurality of pyrometers in a closed-loop configuration, each pyrometer providing a measured signal.

3. The method of claim 2, wherein said heating sources comprise lamps.

4. A method for controlling the temperature of a substrate in a processing chamber, the processing chamber employing a heating control over at least two heating zones, such that each heating zone is independently controllable according to a signal corresponding to the substrate temperature and an offset, comprising the steps of:

growing a first film on a first substrate using a first growth regime;

measuring a first thickness profile across the surface of said first film;

growing a second film on a second substrate using a second growth regime;

measuring a second thickness profile across the surface of said second film;

determining a plurality of differences between said first thickness profile and said second thickness profile; and selecting a value of the offset for at least one of said heating zones such that said selected value bears a direct relationship to said difference.

5. The method of claim 4, wherein the a differences are measured at a plurality of temperature sampling points.

6. The method of claim 4, wherein said first growth regime is a low temperature regime where substrate temperature provides the primary contribution to growth rate.

7. The method of claim 6, wherein said second growth regime is a high temperature regime where gas flow dynamics provides the primary contribution to growth rate.

8. The method of claim 6, wherein said first film is grown at a temperature of less than about 1050° C. at a pressure of about one atmosphere.

9. The method of claim 8, wherein said second film is grown at a temperature of greater than about 1150° C. at a pressure of about one atmosphere.

10. A method for removing the effect of a variable on temperature uniformity across a substrate processed in a chamber, the chamber employing an independent heating control over at least two heating zones, such that each heating zone is independently controllable according to a measured signal corresponding to a substrate temperature and a user-definable offset, comprising the steps of:

growing a first film on a first substrate using a first growth regime where said variable constitutes a minor contribution to a first growth rate;

measuring a first thickness profile across the surface of said first film;

growing a second film on a second substrate using a second growth regime where said variable constitutes a major contribution to a second growth rate;

measuring a second thickness profile across the surface of said second film;

calculating a plurality of differences between said first thickness profile and said second thickness profile; and selecting a value of the offset of each heating zone control, such that said selected values bear a direct relationship to said plurality of calculated differences.

11. The method of claim 10, wherein said variable is gas flow.

12. The method of claim 11, wherein said variable is a function of gas velocity.

13. The method of claim 11, wherein said variable is a function of gas mass.

14. A method for controlling the temperature of a substrate in a process chamber employing a heating control over at least two heating zones, such that each heating zone is independently controllable according to a measured signal corresponding to the substrate temperature and a user-definable offset, comprising the steps of:

growing a first film on a first substrate using a first growth regime where substrate temperature provides the primary contribution to growth rate, at a temperature of less than about 1050° C and at a pressure of about one atmosphere;

measuring a first thickness profile across the surface of said first film;

growing a second film on a second substrate using a second growth regime where gas flow dynamics provides the primary contribution to growth rate, at a temperature of greater than about 1150° C and at a pressure of about one atmosphere;

measuring a second thickness profile across the surface of said second film;

determining a plurality of differences, measured at a plurality of temperature sampling points, between said first thickness profile and said second thickness profile; and selecting a value of the user-definable offset for at least one of said heating zones such that said selected value bears a direct relationship to one of said differences, wherein each of said heating zones includes a plurality of lamps and a plurality of pyrometers in a closed-loop configuration, each pyrometer providing a measured signal.

15. An apparatus for deriving offset values for use in controlling heating zones used to heat a substrate in a process chamber so that the temperature of the substrate has a desired profile across the substrate, the offset values being used with actual values representing measured temperatures at locations across the substrate, the apparatus comprising:

at least one gas deposition source to grow a film on two different substrates under two different heating conditions, a sensor to measure a characteristic of the film across each of the substrates, and a controller configured and arranged to determine the offset values based on a comparison of a measured characteristics of each of the different films grown under the two different heating conditions.

* * * * *